Dec. 30, 1969 E. D. WOLLEY 3,487,276

THYRISTOR HAVING IMPROVED OPERATING CHARACTERISTICS AT HIGH TEMPERATURE

Filed Nov. 15, 1966 2 Sheets-Sheet 1

WITNESSES

INVENTOR
Elden D. Wolley
BY
ATTORNEY

United States Patent Office 3,487,276

Patented Dec. 30, 1969

3,487,276

THYRISTOR HAVING IMPROVED OPERATING CHARACTERISTICS AT HIGH TEMPERATURE

Elden D. Wolley, Monroeville, Pitcairn, Pa., assignor to Westinghouse Electric Corporation, Pittsburgh, Pa., a corporation of Pennsylvania Filed Nov. 15, 1966, Ser. No. 594,599
Int. Cl. H01l *11/10*
U.S. Cl. 317—235 4 Claims

ABSTRACT OF THE DISCLOSURE

This disclosure relates to a thyristor having a high breakover voltage at elevated temperatures as a result of the thyristor having low carrier lifetime in the emitter region or the reverse blocking junction and a high carrier lifetime in the forward blocking junction.

This invention relates to a thyristor having improved operating characteristics and particularly to a thyristor having improved operating characteristics at high temperature.

The thyristor is characterized in that once fired or driven into conduction by application of current to its gate electrode, it can only be turned off by reducing the load current to zero.

Another characteristic of the thyristor which limits its use is the fact that the breakover voltage (that voltage at which a thyristor will fire without the application of any gate current) is greatly reduced with increased temperature.

It is known that the holding current and the leakage current of the forward blocking junction are the two most important parameters in the temperature dependence of the breakover voltage of a controlled rectifier.

The breakover voltage begins to decrease when the leakage current at breakover voltage approaches the holding current. That is, the holding current depends upon the low current emitter efficiencies of the two emitters (anode and cathode); and the emitter efficiencies, in turn, depend upon the lifetime at each junction. The smaller the lifetime in the reverse blocking junction, the larger the current must be to obtain sufficient injection to keep the controlled rectifier in the "ON" state. Thus, a low lifetime in the reverse blocking junction yields a high holding current. The leakage current in the forward blocking junction, on the other hand, is a result of generation currents in the depletion region (neglecting surface leakage) and is inversely proportional to the lifetime. Thus, the lower the lifetime, the higher the leakage current at any given temperature and the sooner the breakover voltage will decrease with increasing temperature.

Obviously then, in order to maintain a high breakover voltage at a high temperature, it is necessary to have a low lifetime in the region of the reverse blocking junction and a high lifetime in the forward blocking junction. In order to maintain a low forward drop, it is necessary to maintain a relatively high lifetime in the regions between the junctions.

Various methods have been proposed for maintaining a high breakover voltage in a thyristor at elevated temperatures, including the use of shorted or shunted emitters, however, the various techniques have proven ineffective for high current devices.

An object of the present invention is to provide a thyristor which can be turned off by a gate signal without reducing the load current to zero.

Another object of the present invention is to provide a thyristor capable of maintaining a high breakover voltage at elevated temperatures as a result of the thyristor having low carrier lifetime in the emitter regions or the reverse blocking junction and a high carrier lifetime in the forward or inner blocking junction.

Other objects will, in part, be obvious and will, in part, appear hereinafter.

For a better understanding of the nature and objects of the present invention, reference should be had to the following detailed description and drawing in which.

In accordance with the present invention and attainment of the foregoing object there is provided a thyristor comprising a wafer of semiconductive material having four alternate P-type and N-type regions, the regions at the opposite ends of the wafer comprising anode and cathode emitters, the two intermediate regions between the emitter regions comprising a base region and a gate region, and gold diffused into one of said emitter regions and a portion of the adjacent base region to lower the carrier lifetime in the gold diffused regions.

Figure 1:
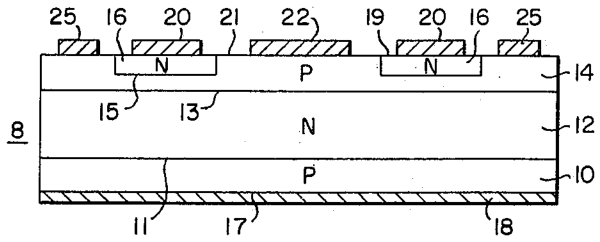
FIG. 1 is a side view in cross-section of a thyristor prepared in accordance with the teachings of this invention.
Figure 2:
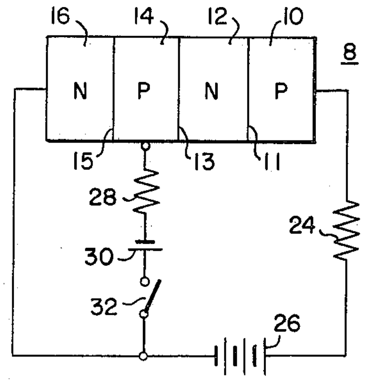
FIG. 2 is a schematic circuit diagram illustrating the operation of the thyristor of FIG. 1.

More specifically and with reference to FIGS. 1 and 2, there is shown a thyristor 8 made in accordance with the teachings of this invention.

The thyristor 8 of FIGS. 1 and 2 comprises a wafer of silicon having a lower P-type region 10, and intermediate N-type region 12 and an upper P-type region 14. In addition, there is an annular N-type region 16 formed in a portion of P-type region 14.

There is a P-N junction 11 between regions 10 and 12; a P-N junction 13 between regions 12 and 14 and a P-N junction 15 between regions 14 and 16.

An electrical contact 18 is affixed to lower surface 17 of P-type region 10; an annular electrical contact 20 is affixed to surface 19 of N-type region 16 and an electrical contact 22 and an electrical contact 25 are affixed to surface 21 of the P-type region 14.

It is an important feature of this invention and essential if the device is to maintain its high breakover voltage at high temperatures that the anode base, region 12, have a thickness two to three times the thickness of the anode emitter, region 10.

With reference to FIG. 2 the lower P-type region 10 comprises the anode emitter of the device and is connected through a load impedance 24 to the positive side of a source of driving potential 26. The negative side of the potential source 26 is connected to the cathode emitter comprising the annular N-type region 16. The P-type region 14 comprises the gate of the thyristor and may be connected through resistance 28 to a source of biasing potential, such as battery 30. When a switch 32, located in the circuit as illustrated, is closed, the gate 14 is biased in the reverse direction, thereby causing the thyristor to "turn-off." The P-N junction 11 between the anode emitter 10 and the base 12 comprises the reverse blocking junction of the thyristor; while the P-N junction 13 between the base 12 and gate 14 comprises the forward blocking junction.

As was explained above, the breakover voltage of the rectifier can be maintained at high temperatures, and the device can be turned off by a reverse gate current, if the lifetime is low in the region of the anode emitter 10 and reverse blocking junction 11 but high in the P-type region 14, which comprises the gate and the forward blocking junction 13.

This is achieved in accordance with the present invention by diffusing gold into the lower surface 17 of the P-type region 10 which is the anode emitter such that the tail of the gold diffusion projects into the N-type region 12 which is the base. The result of this gold diffusion is that the holding current of the device is increased because of increased recombination in the region 10 which serves as the anode emitter and, to some extent, the transport in the N-type region 12 which is the base lowered. The increased holding current makes the forward blocking voltage of the device less temperature sensitive and the load current need not be reduced to a low value to insure that the device is off. As will be appreciated, this reduces the total time required for turn-off.

The fact that the tail of the gold diffusion extends into the N-type base region 12 can be used to adjust the transport of minority carriers in that region and, depending upon the transport before gold diffusion, to enhance the turn-off current gain. Furthermore, the lower lifetime in the N-type base region 12 decreases the fall time of the turn-off of the thyristor. Finally, the width of the N-type base 12 and the gold diffusion depth can be adjusted such that the lifetime is not made too low in the depletion region of the forward blocking junction between P-type gate region 14 and N-type base 12. Thus, the leakage current due to generation currents will remain low, assuring high breakover voltage and low degradation of this voltage with temperature.

In describing the preparation of the device of this invention, it will be assumed that the starting material is a wafer of N-type silicon having a thickness of 10 mils. Such a wafer is shown in FIG. 3.

Figure 6:
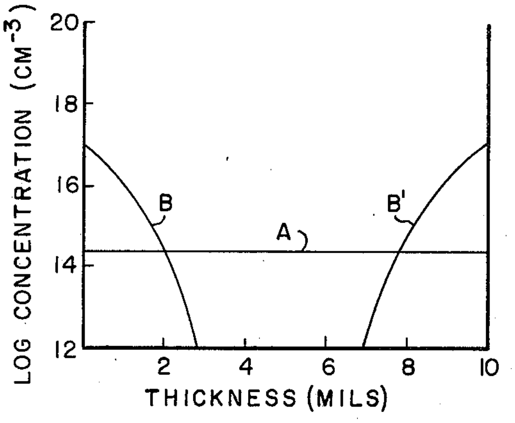
FIG. 6 is a graphical presentation of the diffusion profile of the wafer of FIG. 5.
Figure 8:
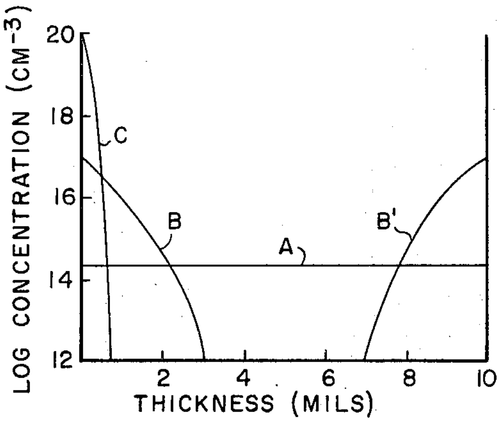
FIG. 8 is a graphical presentation of the diffusion profile of the wafer of FIG. 8.
Figure 10:
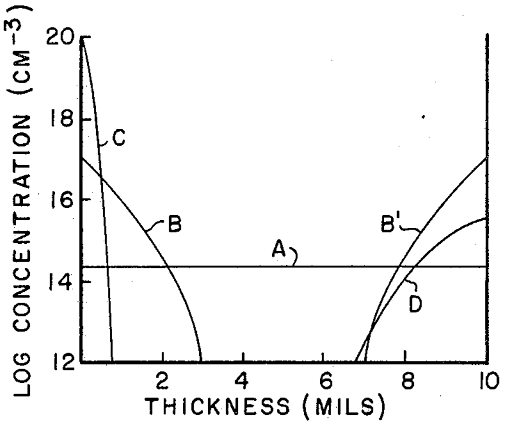
FIG. 10 is a graphical presentation of the diffusion profile of the wafer of FIG. 9.

The wafer has an N-type impurity disposed uniformly therethrough. The disposal of the N-type impurity is shown graphically as line A in FIG. 4. The left side of the graph of FIG. 4, and the subsequent graphs of FIGS. 6, 8, and 10, represents the top surface 21 of the wafer 7 and the right side of the graph represents the bottom surface 17 of the wafer 7.

It will, of course, be understood that the thickness of 10 mils and the initial doping concentration has been adopted only for the purposes of simplifying the explanation and that thinner or thicker wafers doped more or less may be used in practicing this invention on the device for opening contact area to the cathode emitter 16, it is necessary to have a surface with a reasonable degree of polish. This polished surface may be obtained either by etch polishing in a mixture of hydrofluoric and nitric acids or by employing previously micropolished wafers. The wafers which are etch polished are generally lapped on 600 grit until they are about 12 mils thick and then given a light hand lap with 600 grip powder. After etching, the thickness of the slices ranges from about 10 to 11 mils. Micropolished samples are generally lapped with 600 grit material to 11 mils on the unpolished side and after degreasing given an etch in a mixture of hydrofluoric and nitric acids. Only de-ionized water is used to rinse the wafer; and the slices are stored in deionized water until the time for the following P-type diffusion.

Figure 3:
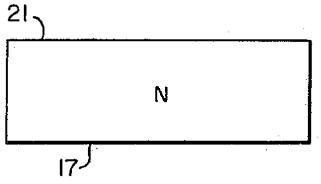
FIG. 3 is a side view, in cross-section, of a wafer of semiconductor material suitable for use in accordance with the teachings of this invention.
Figure 5:
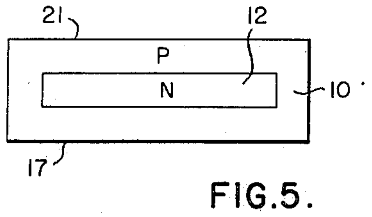
FIG. 5 is a side view, in cross-section, of the wafer of FIG. 3 being processed in accordance with the teachings of this invention.

With reference to FIG. 5, a region 10 of P-type semiconductivity is formed within the wafer of FIG. 3 by diffusion. It is an essential feature of this invention that region 12 have a final thickness two to three times the final thickness of region 10. The wafer now has a central N-type region 12 surrounded by a P-type region 10. The diffusion profile is shown in FIG. 6. The P-type impurity, denoted by lines B and B′ projects inwardly from the top and bottom of the wafer with gradually decreasing concentrations. Preferably, the impurity used to produce region 10 is boron. Diffusion may be carried out in an open tube with a $B_2O_3$ source at 1000° C. and silicon wafers heated to 1100° C. A high purity nitrogen carrier gas flow 700 cubic centimeters per minute is used, and the diffusion time is sufficient to produce the required profile which, in the example given above, means that the depths of the diffusions should be in the range of about 40 or 45 microns.

In certain cases, instead of simply diffusing boron into the wafer, a boron pre-deposit may be employed, followed by aluminum diffusion and boron drive, these latter steps being carried out simultaneously.

Following the formation of the P-type region 10, the entire surface of the wafer is oxidized for emitter masking. Preferably, the oxidation is carried out for about four hours at 1200° C. in wet argon. The four-hour oxidation yields an oxide of about 17,000 A. An oxide of this thickness is used to facilitate alignment of the next mask which is used to open windows for emitter and gate contacts. A thinner oxide of about 5000 A. is grown over the emitter during the phosphorus drive-in to be described hereinafter. Thus, a relatively large step in the oxide thickness at the edge of the emitter is available for alignment of the emitter-base contact windows.

Figure 7:
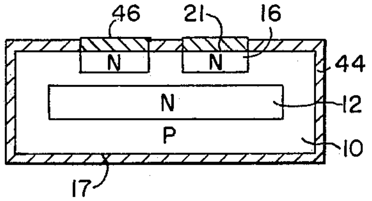
FIG. 7 is a side view in cross-section of the wafer of FIG. 3 undergoing further processing in accordance with the teachings of this invention.

The oxide layer of silicon dioxide is shown in FIG. 7 and identified by the reference numeral 44. An annular window 46 is then formed in the oxide mask 44 for the N-type emitter diffusion. Standard photoresist techniques are employed to form the window 46. That is, the whole wafer with the oxide applied is covered with an organic monomer or photoresist layer which polymerizes when subjected to ultraviolet radiation. Usually, the monomer is applied in liquid form, allowed to dry, and thereafter exposed to ultraviolet light. In this particular case, the entire wafer will be exposed to the ultraviolet light, except for the annular area defined by the window 46. In this process, all but the annular area of the window 46 becomes polymerized. Washing of the coated wafer in a suitable solvent for the monomer now removes the photoresist layer defined by the window 46. The remaining areas, still covered by the polymer, protect the silicon film during the next process, which is immersion of the wafer in a slow etch, usually consisting of a mixture of hydrofluoric and ammonium fluoride. The etch thus removes the silica film from all but the areas covered by the polymer.

In order to form the N-type cathode emitter region 16, phosphorus is diffused into the P-type region 14 through the annular window 46. Preferably, phosphorus diffusion is carried out in two steps, the first of which is a phosphorus predeposition which is carried out in an open-tube two-zone furnace in which phosphorus pentoxide is used as a source. The source temperature is preferably about 240° C. and the diffusion temperature is 1100° C. Nitrogen is used as a carrier gas at a flow of about 1200 cubic centimeters per minute.

After the phosphorus pre-diffusion, the wafers are etched in dilute hydrofluoric acid for thirty seconds in order to remove the glass formed on the surface during the prediffusion. The wafers are then rinsed in de-ionized water, dried and placed on edge in a slotted quartz boat and placed in a single-zone furnace at 1200° C. for redistribution or drive-in of the previously deposited phosphorus.

During the first fifteen minutes of the redistribution, an oxide of about 5000 angstrom units is grown over the emitter area. The oxide is obtained by bubbling the nitrogen carrier gas through water at 97° C. The flow rate of the nitrogen is 200 cubic centimeters per minute. After the first fifteen minutes, the water bubbler is by-passed and the remainder of the redistribution is carried out in a flow of dry nitrogen.

The diffusion profile of the wafer at this stage of the process is shown in FIG. 8. A P-type impurity projects into the top and bottom of the wafer as represented by the curves B and B′, the curve B′ representing anode emitter of FIG. 1 and the curve B representing the gate. Diffused into an annular region of the gate, in turn, is an N-type impurity represented by the curve C and comprising the N-type cathode emitter of FIG. 1.

Figure 9:
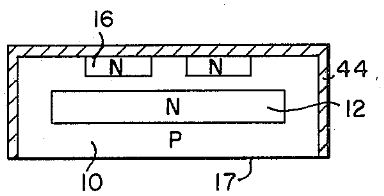
FIG. 9 is a side view in cross-section of the wafer of FIG. 3 undergoing still further processing in accordance with the teachings of this invention.

Following the phosphorus redistribution or diffusion step, gold is diffused into and through the anode-emitter of region 10 of the wafer in accordance with the teachings of Patent No. 3,440,113 issued Apr. 22, 1969 and assigned to the assignee of the present application. Briefly, the gold diffusion is carried out by removing that portion of the oxide mask 44 covering the bottom of the wafer and diffusing through surface 17 of the wafer. The wafer at this stage of processing is shown in FIG. 9. In order to diffuse gold into the bottom of the wafer and into region 12, a gold compound and the wafer are heated within a quartz ampule to a temperature of at least 700° C. and preferably at least 850° C. The gold compound is preferably a halide such as $AuCl_3$, AuCl, $AuBr_3$, AuBr, AuI, or $AUI_3$; however it may comprise gold cyanide. After the wafer and the gold compound are deposited in the capsule, the capsule is evacuated until a vacuum of approximately $10^{-5}$ torr is obtained. Thereafter, the capsule is sealed and placed in a preheated furnace at a temperature of at least 700° C. The diffusion time will ordinarily vary from about ten to thirty minutes; however, a period of thirty minutes has been used most frequently and has provided the best results.

As can be seen from the diffusion profile, FIG. 10, the wafer now has P-type regions diffused into its opposite sides as represented by curves B and B′, a relatively shallow annular N-type region diffused into its upper surface as represented by the curve C and gold diffused into its bottom portion as represented by D. By removing the silicon layer from the top of the wafer and by grinding off the edges of the wafer to separate the P-type anode emitter and gate regions, the structure of FIG. 1 results and region 10 is divided into regions 10 and 14. As was explained above, the gold diffused into the anode emitter region and the region of the reverse blocking junction lowers the lifetime in these regions and results in the ability to turn off the device with a reverse gate current. At the same time, the breakover voltage of the device becomes less temperature sensitive.

As a specific example, silicon wafers of 15 to 25 ohm-centimeter material, 9.5 to 10 centimeters thick, were diffused with boron and aluminum in accordance with the process given above to a depth of about 1.55 mils. The samples were thereafter oxidized and a window opened for a phosphorus diffusion. Phosphorus was diffused in the manner described above to a depth of 10 to 11 microns to form the cathode emitter and an oxide grown over the window. Some of the wafers were set aside and the others had the oxide removed from their lower sides (i.e., the anode emitter side). Those from which the oxide had been removed from the underside were gold diffused as described above for ten minutes at 850° C. The oxide coatings were then removed and devices were fabricated by applying contacts and grooves etched to isolate the P-type anode emitter from the P-type gate. The following Table I lists the turn-off and turn-on parameters of two units from the gold diffused and non-gold diffused parts:

TABLE I.—COMPARISON OF GOLD DIFFUSED AND NON-GOLD DIFFUSED CONTROLLED RECTIFIERS AT ROOM TEMPERATURE

| | Non-gold diffused | | | Gold diffused, |
|---|---|---|---|---|
| Sample No. | TO-0202 | TO-0202 | TO-0203A | TO-0205A |
| $IV_{BO}$ (volts) | 500 | 320 | 500 | 30 |
| $I_h$ (ma.) | .1 | .1 | 125 | 60 |
| $I_{gfo}$ (ma.) | 15 | .5 | 30 | 110 |
| $V_f$ at 1 amp (volts) | .79 | .78 | 1.39 | 1.2 |
| $V_f$ at 5 amp (volts) | .92 | .90 | 1.56 | 1.5 |
| MAX $I_{ato}$ (amps) | .09 | .03 | 10 | 8 |

$V_{BO}$—breakover voltage. $I_h$—holding current as measured on oscilloscope (gate open value is larger than this value). $I_{gfo}$—gate current necessary to reduce $V_{BO}$ to less than 3 volts. $V_f$ at 1 amp—on forward voltage drop at 1 amperes. $V_f$ at 5 amp—on forward voltage drop at 5 amperes. MAX $I_{ato}$—maximum load current which can be turned off with a gate current of 1 ampere for 20 microseconds with an anode voltage of 100 volts.

From the foregoing table, it will be appreciated that for the conditions listed, the units which were not gold diffused turn off tens of milliamperes of current, while the gold diffused units are capable of turning off amperes. This is primarily a result of the short gate drive time (20 microseconds) and the long time constant and small holding current in the non-gold diffused devices. If the gate drive for turn-off were made much longer, the units which were not diffused with gold should turn off at least one ampere. It will be immediately apparent from Table I that the maximum load current which can be turned off with a given gate current applied for a predetermined amount of time increases dramatically for the gold-diffused samples.

To illustrate the effect of the gold diffusion on breakover voltage with increasing temperatures, silicon wafers again of 15 to 25 ohm-centimeter material were diffused with boron to a temperature of approximately 40 microns. Phosphorus was then diffused into one side through an annular oxide window to a depth of 12 microns to form the cathode emitter shown in FIG. 1. During the phosphorus diffusion, an oxide of about 5000 A. thickness was grown in the emitter window. Some of the wafers thus treated were used to make controlled rectifiers with no further diffusion and some were gold diffused in the manner described above with the oxide removed from the anode-emitter side. The gold diffusion was carried out in a sealed tube at 850° C. for ten minutes using gold chloride as the source of gold.

The parameters of a controlled rectifier from each group are given as a function of temperature in the following Table II:

COMPARISON OF SWITCH PARAMETERS FOR NON-GOLD DIFFUSED (A) AND GOLD DIFFUSED (B) RECTIFIERS

| | 150° C. | | 125° C. | | 125° C. | | 150° C. | |
|---|---|---|---|---|---|---|---|---|
| | A | B | A | B | A | B | A | B |
| $V_{BO}$ volts | 320 | 500 | 320 | 500 | 220 | 400 | 30 | 40 |
| $I_h$ (ma) | .1 | 60 | .1 | 30 | .1 | 30 | .1 | 40 |
| $I_{gfo}$ (ma.) | .5 | 11 | .1 | 1.8 | .1 | 1.5 | .1 | 1.0 |
| $V_f$ at 1 amp | 86 | 1.2 | | | | | | |
| $V_f$ at 5 amp | 1.05 | 1.5 | | | | | | |

$V_{BO}$—forward breakover voltage. $I_h$—holding current. $I_{gfo}$—gate current necessary to reduce $V_{BO}$ to less than 2 volts. $V_f$ at 1 amp—on voltage drop at 1 amp. $V_f$ at 5 amp—on voltage drop at 5 amp.

The holding current given in the foregoing Table II was read on an oscilloscope with enough gate current flowing to fire the device. Hence, the holding current with the gate open would be greater than the value given in the table. The area of the N-type emitter in these devices is about $6\times10^{-2}$ square centimeters. From the table, it is apparent that the holding and gate firing current increase after gold diffusion for all temperatures. Furthermore, the breakover voltage is consistently higher in the case of the gold-diffused sample (B) than in the case of the non-gold-diffused sample (A).

Figure 4:
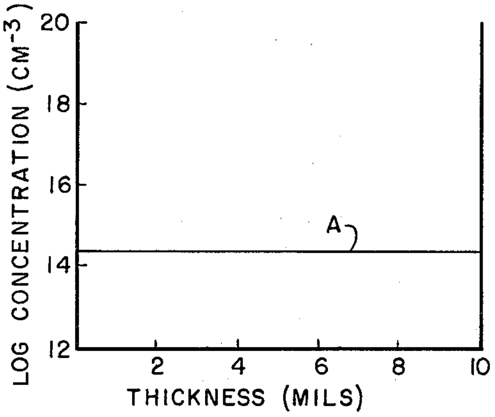
FIG. 4 is a graphical presentation of the diffusion profile of the wafer of FIG. 3.

The geometry of the cathode emitter is also important in providing a suitable gate turn-off device. This is illustrated in FIG. 4 wherein elements corresponding to those of FIG. 1 are identified by like reference numerals. In this case, however, the cathode emitter 16 is in the form of a circular button rather than an annular region. Aside from this, however, the device is the same.

Figure 11:
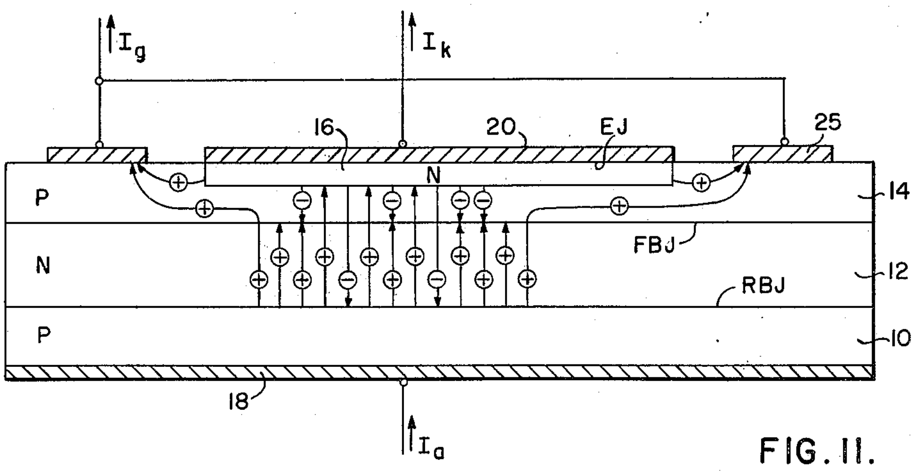
FIG. 11 is a side view in cross-section of the device of this invention in the partially turned off state.

Gate turn-off is accomplished by reverse biasing the cathode emitter 16. In order to reverse bias the cathode emitter, minority carriers (identified as plus signs within circles in FIG. 11) must be removed from the gated base region of the switch. The removal of charge and turn-off starts from the edge of the cathode emitter 16 adjacent the gate contact 25. In FIG. 11 a controlled rectifier is shown which is partially turned off. The portion of the cathode emitter junction EJ, adjacent to the gate contact 25 is reverse biased; and the portion of the forward blocking junction FBJ underneath the reverse biased part of junction EJ is no longer forward biased, or in saturation in transistor terminology. The minority charge on the gated base below the portion of the junction EJ which is reverse biased has been removed. Thus, the gate current, $I_g$, must flow laterally through a base resistance determined by the geometry of the cathode emitter and gate, the ungated base width, and the unmodulated conductivity of the base. In this intermediate state, the central portion of the device is still "ON." That is, the blocking junction and the cathode emitter junction are forward biased. The anode current is relatively unchanged and is determined by the external circuit. Since the "ON" area has been reduced by the gate current, the current density in regions that remain "ON" is higher than when the whole device was conducting. The concentration of current into a smaller region can be referred to as "squeezing" of current or "ON" area. This is analogous to crowding in transistors but opposite in that crowding current in a transistor is concentrated or "pulled" toward the emitter periphery; whereas in this case the current is "pushed" away from the periphery.

The cathode emitter stripe width also determines the maximum current which can be controlled by the device. When the "ON" region is squeezed to the limit required for turn-off, the gate current must flow through a resistance determined by the unmodulated base resistivity and the geometry of the base. This resistance is:

$$R_b = P_b \frac{S - L_n}{w_b T}$$

where $R_b$=resistance determined by the unmodulated base resistivity and the geometry of the base
$P_b$=average base resistivity of gated beam
S=cathode emitter stripe width
$L_n$=diffusion length of electrons in the base 12
$w_b$=the base width of the gated base and
T=length of the cathode emitter.

If the gate current times this resistance exceeds the reverse breakdown voltage of the cathode emitter 16, then that value of the gate current cannot be made to flow from the "ON" region. Thus, the maximum gate current which can be used in turn-off is given by:

$$I_{g(max.)} = \frac{V_{BRK}}{R_b}$$

where
$V_{BRK}$=the reverse breakdown voltage of the cathode emitter
The maximum current which can be controlled by the device is then given by:

$$I_{a(max.)} = g(\text{max.}) \frac{V_{BRK}}{R_b}$$

where $$g(\text{max.}) = \frac{I_a}{I_{g(min.)}}$$

Since the value of $R_b$ increases as the emitter strip width increases, resulting in a reduction in the maximum anode current $I_{a(max)}$, it will be appreciated that the emitter stripe width must be small to control any magnitude of current.

Although the invention has been shown in connection with a certain specific embodiment, it will be readily apparent to those skilled in the art that various changes in form and arrangement of parts may be made to suit requirements without departing from the spirit and scope of the invention. In this respect, it will be apparent that while a PNP device has been described herein, the invention is equally applicable to an NPNP device with the N and P regions interchanged.

I claim as my invention:

1. A thyristor comprising a wafer of semiconductive material, said wafer having four alternate regions of P-type and N-type semiconductivity, the regions at the opposite ends of the wafer comprising anode and cathode emitters, the two inner regions being base regions relative to the adjacent emitter regions, gold diffused into one of said emitter regions and into the adjacent base region to lower carrier lifetime in the gold diffused regions and said adjacent base region being at least twice as thick as the one emitter region.

2. The device of claim 1 in which the base region into which gold is diffused is up to four times as thick as the adjacent gold diffused emitter region.

3. The device of claim 2 in which the gold diffused emitter is the anode emitter.

4. The device of claim 2 in which the gold diffused emitter has a P-type semiconductivity and is the anode emitter.

References Cited

UNITED STATES PATENTS

| | | | |
|---|---|---|---|
| 3,342,651 | 9/1967 | Raithel | 148—188 |
| 3,356,543 | 12/1967 | Desmond et al. | 148—186 |

JAMES D. KALLAM, Primary Examiner

U.S. Cl. X.R.

317—234